United States Patent [19]
Nam et al.

[11] Patent Number: 5,981,351
[45] Date of Patent: Nov. 9, 1999

[54] METHOD OF FORMING CAPACITOR OF A SEMICONDUCTOR DEVICE AND A SEMICONDUCTOR CAPACITOR FORMED THEREBY

[75] Inventors: Ki-huem Nam; Hyun Han; Jin-oh Choi, all of Kyungki-do, Rep. of Korea

[73] Assignee: Samsun Electronics Co., Ltd., Suwon, Rep. of Korea

[21] Appl. No.: 09/184,856

[22] Filed: Nov. 3, 1998

[30] Foreign Application Priority Data

Dec. 19, 1997 [KR] Rep. of Korea ........................ 97-66287

[51] Int. Cl.$^6$ ........................................................ H01L 21/20
[52] U.S. Cl. ................................................ 438/398; 438/255
[58] Field of Search ................................... 438/398, 396, 438/397, 253, 254, 255

[56] References Cited

U.S. PATENT DOCUMENTS

| | | | |
|---|---|---|---|
| 5,049,517 | 9/1991 | Liu et al. | 438/255 |
| 5,759,893 | 6/1998 | Wu | 438/255 |
| 5,759,895 | 6/1998 | Tseng | 438/255 |
| 5,766,995 | 6/1998 | Wu | 438/255 |
| 5,851,878 | 12/1998 | Huang | 438/255 |

*Primary Examiner*—Tuan H. Nguyen
*Attorney, Agent, or Firm*—Jones Volentine, L.L.P.

[57] ABSTRACT

A method of forming a capacitor of semiconductor devices, and the capacitor formed thereby, improves the reliability of semiconductor devices by maximizing the capacitance of the capacitor through the stable increase of the surface area of its lower electrode material layer. The method includes: a) forming insulating layers with an oxide film placed on the top in sequence on a semiconductor substrate with a pattern formed thereon, and removing a predetermined portion of the insulating layers so as to form a contact hole; b) forming a lower electrode material layer of a capacitor on the oxide film over the semiconductor substrate containing the contact hole; c) removing the lower electrode material layer so as to expose a certain portion of the oxide film; d) undercutting the oxide film exposed by the removing of the lower electrode material layer; e) cleaning the surface containing the lower surface of the lower electrode material layer exposed by the undercutting of the oxide film; and f) carrying out a hemispherical grain (HSG) process in order to increase the surface area containing the lower surface of the lower electrode material layer exposed by the undercutting of the oxide film. The resultant capacitor has a lower surface of a lower electrode having a hemispherical shape.

26 Claims, 5 Drawing Sheets

METHOD OF FORMING CAPACITOR OF A SEMICONDUCTOR DEVICE AND A SEMICONDUCTOR CAPACITOR FORMED THEREBY

This application claims priority under 35 U.S.C. §119 to Korean Patent Application No, 97-66287 filed Dec. 5, 1997, which is hereby incorporated by reference in its entirety.

FIELD OF THE INVENTION

The present invention relates to a method of forming a capacitor of a semiconductor device and a semiconductor capacitor formed thereby, and more particularly, wherein undercutting of an oxide film and cleaning is carried out "in situ" and then, hemispherical grain (HSG) process is carried out.

DESCRIPTION OF THE RELATED ART

Generally, a capacitor of semiconductor devices is used as a memory device to store charges as information. The capacitance of this capacitor is proportional to the effective capacitor electrode area and inversely proportional to the distance between the two electrodes. Therefore, there has been a need to increase the effective area.

Currently, the surface area of the capacitor is generally increased by employing an HSG process by which the surface of a lower electrode material layer of the capacitor, e.g. a polysilicon film, is formed as hemispherical-shape. FIGS. 1 to 4 are cross-sectional views showing the conventional method of forming a capacitor of a semiconductor device.

First, FIG. 1 shows a contact hole 13 formed over an insulating layer 12 and an oxide film 14 formed on a semiconductor substrate 10 in sequence. In addition, a side wall spacer 16 is formed on the side walls of the insulating layer 12 and the oxide film 14. Then, a poly silicon film 18 as a lower electrode material layer of the capacitor is formed over the semiconductor substrate having a side wall spacer 16 and the contact hole 13 so as to form a predetermined pattern.

FIG. 2 shows that HSG process for increasing the surface area is carried out so as to form the surface of the polysilicon film 18 having a hemispherical shape. Then, FIG. 3 shows that the oxide film 14 exposed under the polysilicon film 18 is undercut for the pattern formation. FIG. 4 shows that the above undercut oxide film 14 over the semiconductor substrate 10 is cleaned.

In the conventional semiconductor capacitor formation process, the undercutting of the oxide film 14 and cleaning thereof is carried out after HSG process for increasing the surface area of the polysilicon film 18. This results in the surface of the hemispherical-shaped polysilicon film 18 formed by the HSG process is destroyed due to the chemicals or other agents used during the undercutting of the oxide film 14 and the cleaning.

This destruction of the surface of the hemispherical-shaped polysilicon film 18 results in the reduction of the surface area of the polysilicon film 18, a lower electrode of the capacitor, and causes a decrease in the capacitance. Therefore, as described above, the capacitance of capacitor is decreased due to the above destruction of the surface of the polysilicon film, formed as a lower electrode material layer of the capacitor thereby resulting in the reduction of reliability of semiconductor devices.

SUMMARY OF THE INVENTION

The present invention is directed to providing a method of forming a semiconductor capacitor and a semiconductor capacitor formed thereby for increasing the capacitance of the capacitor and improving the reliability of the semiconductor devices by providing a stably-increased surface area of the lower electrode material layer to be formed as capacitor.

To achieve these and other advantages and in accordance with the purpose of the present invention, the method of forming a semiconductor capacitor includes a) forming insulating layers with an oxide film placed on the top in sequence on a semiconductor substrate with a pattern formed thereon, and removing a predetermined portion of the insulating layers so as to form a contact hole; b) forming a lower electrode material layer of a capacitor on the oxide film over the semiconductor substrate containing the contact hole; c) removing the lower electrode material layer such that a certain portion of the oxide film is exposed; d) undercutting the oxide film exposed by the removal of the lower electrode material layer; e) cleaning the surface containing the lower surface of the lower electrode material layer exposed by the undercutting of the oxide film; and f) carrying out a hemispherical grain (HSG) process in order to increase the surface area containing the lower surface of the lower electrode material layer exposed by the undercutting of the oxide film.

The method may further include forming a side wall spacer on the side walls of the insulating layers including the contact hole between the above steps a) and the b). The side wall spacer may be a nitride film.

The method may further include forming an insulating film over the lower electrode material layer after cleaning the lower electrode material layer with its surface increased by the above HSG process. The lower electrode material layer with its surface area increased by the HSG process is cleaned by using SC-1 chemical.

The certain films under the oxide film are preferably intermediate insulating layers, and the oxide film is preferably a High Temperature Oxide (HTO) film. The oxide film is preferably formed with 1,000 to 2,000 Å of thickness. Preferably, the intermediate insulating layer is a Boron Phosphorus Silicate Glass (BPSG) film, and the lower electrode material layer is preferably a polysilicon film. The polysilicon film is preferably formed with 7,000 to 12,000 Å of thickness, and preferably, the polysilicon film is an amorphous polysilicon film.

The undercutting of the oxide film and the cleaning may be carried out "in-situ" by using a bath containing different kinds of chemicals from one another. The undercutting and the cleaning may be carried out by performing a first bath process using chemicals having HF and $NH_4F$ mixed together, a second bath process using SC-1 chemical, and a third bath process using HF chemical in sequence. The first bath process may be carried out at a temperature of 20 to 30° C. for 90 to 120 sec, the second bath process may be carried out at a temperature of 60 to 80° C. for 300 to 600 sec, and the third bath process may be carried out at a temperature of 20 to 30° C. for 60 to 180 sec.

The HSG process may be performed in such a manner that a seeding process and an annealing process are carried out in sequence. The seeding process and the annealing process may be carried out "in-situ" inside one processing chamber. The seeding process may be carried out at a temperature of 550 to 570° C. with $10^{-2}$ to $10^{-4}$ Torr of pressure for 45 to 55 min. The seeding process may be carried out by supplying $SiH_4$ gas to the presupplied He (helium) gas at a rate of 80 to 140 cc per min. The seeding process may be carried out such that the mixed ratio of He (helium) gas and $SiH_4$ gas is maintained with 1 to 1.5:1. The annealing process may be carried out at temperature of 550 to 570° C. with $10^{-7}$ to $10^{-9}$ Torr pressure for 50 to 60 min.

To achieve these and other advantages and in accordance with the purpose of the present invention, a method of forming a capacitor of semiconductor devices according to this invention includes: a) forming multi-layers comprising an intermediate insulating layer and an oxide film in sequence over a semiconductor substrate with a predetermined pattern thereon, and removing a certain portion of the above multi-layers; b) forming a side wall spacer with a nitride film on the side walls of the multi-layers including the contact hole; c) forming an amorphous polysilicon film, a lower electrode material layer of a capacitor, over a semiconductor substrate having the side wall spacer and the contact hole; d) removing a part of the amorphous poly silicon film such that a certain portion of the oxide film is exposed; e) undercutting the oxide film exposed by the removing of the amorphous polysilicon film; f) cleaning the surface including the lower surface of the amorphous polysilicon film exposed by the undercutting of the oxide film; g) carrying out HSG process such that the surface area including the lower surface of the amorphous polysilicon film exposed by the undercutting of the oxide film is increased; h) cleaning the amorphous polysilicon film with its surface area increased by the HSG process; and i) forming an insulating film over the amorphous polysilicon film.

The undercutting and the cleaning may be carried out by "in situ" performing a first bath process using chemicals having HF and $NH_4F$ mixed together, a second bath process using SC-1 chemical, and a third bath process using HF chemical. The first bath process may be carried out at a temperature of 20 to 30° C. for 90 to 120 sec, the second bath process may be carried out at a temperature of 60 to 80° C. for 300 to 600 sec, and the third bath process may be carried out at a temperature of 20 to 30° C. for 60 to 180 sec.

To achieve these and other advantages and in accordance with the purpose of the present invention, a semiconductor capacitor according to the present invention includes a lower electrode and an upper electrode, wherein a portion of a lower surface of the lower electrode of the capacitor over intermediate insulating layers is formed having a hemispherical shape. The lower electrode is preferably an amorphous polysilicon film, and the lower electrode is preferably has a thickness between 7,000 to 12,000 Å.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be described with reference to the drawings, in which.

DETAILED DESCRIPTION OF THE PREFERRED EMBODIMENTS

Figure 1:
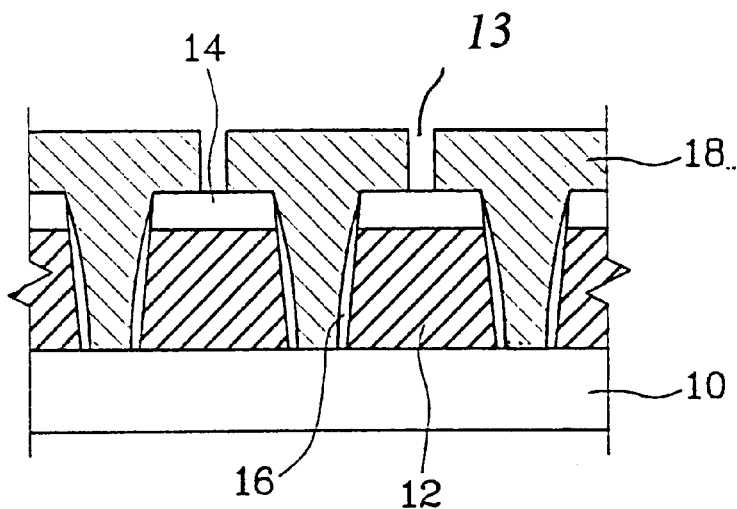
FIGS. 1 to 4 are cross-sectional views showing the conventional method of forming a capacitor of semiconductor device.
Figure 2:
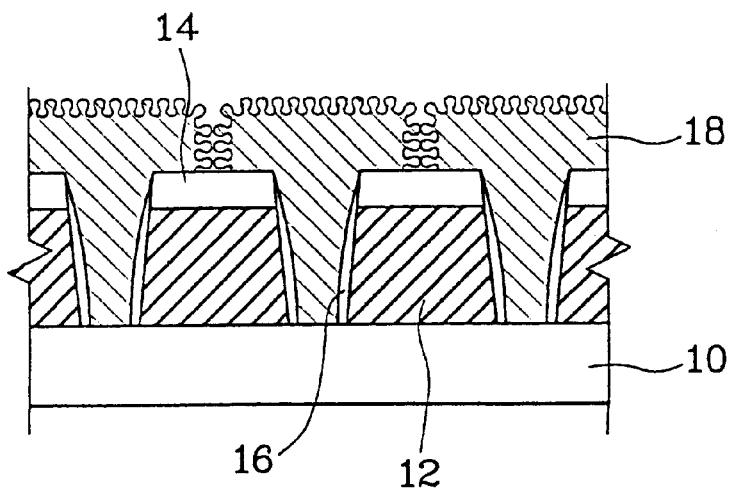
Figure 3:
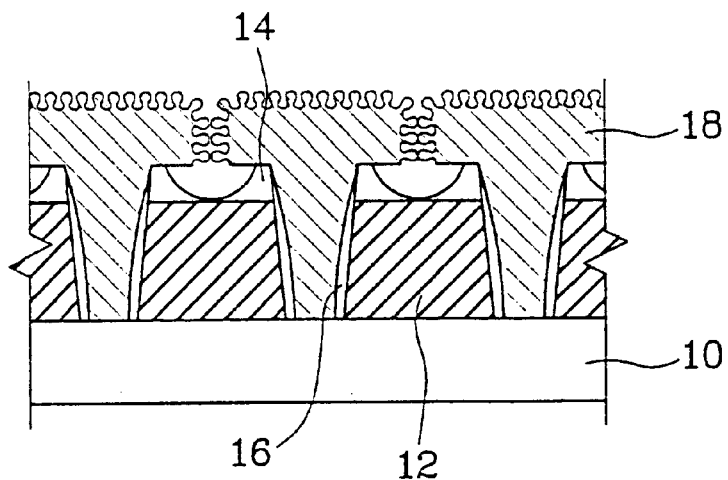
Figure 4:
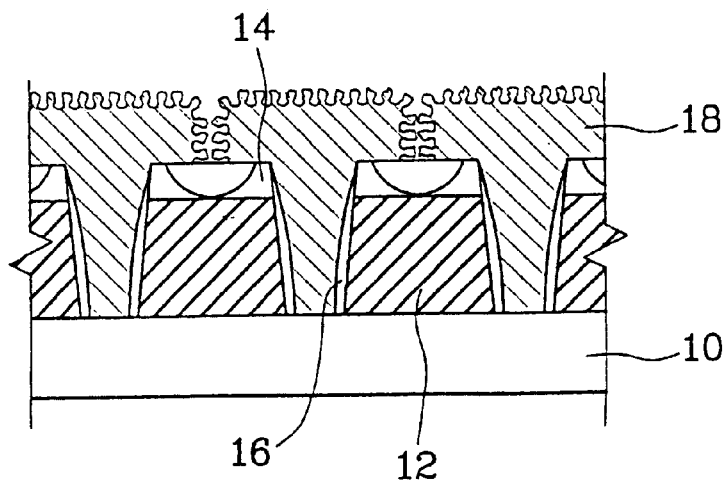

The present invention will be described in detail through preferred embodiments with reference to accompanying drawings. However, the present invention is not limited to the following embodiments but may be implemented in various types. The preferred embodiments are only provided to make the disclosure of the invention complete and make one having an ordinary skill in the art know the scope of the invention. The thicknesses of various layers and regions are emphasized for clarity in accompanying drawings. Also, when a layer is defined to exist on another layer or a substrate, the layer may exist directly on another layer or substrate, or an interlayer layer may be present therebetween. Throughout the drawings, the same reference numerals denote the same elements.

FIGS. 5 to 13 are cross-sectional views of an embodiment of the method of forming a capacitor of semiconductor devices according to the present invention.

Figure 5:
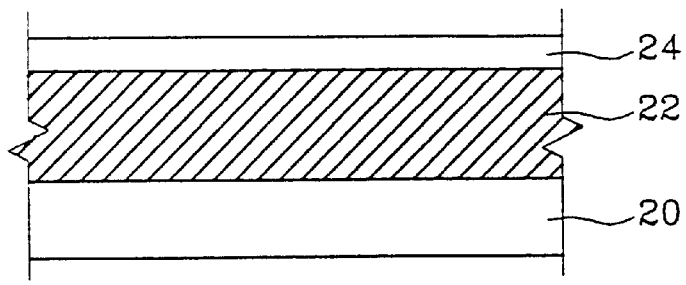
FIGS. 5 to 13 are cross-sectional views showing one embodiment of the method of forming a capacitor of semiconductor device according to the present invention.

First, FIG. 5 shows that an insulating layer 22 and an oxide film 24 are formed in sequence on a semiconductor substrate 20 with a pattern formed thereon. In the present invention, several insulating films and the oxide film 24 are formed over the semiconductor substrate 20, wherein the oxide film 24 is placed on the top.

In a specific example, the insulating layer 22 is a boron phosphorus silicate glass (BPSG) film, serving as an intermediate insulating layer. The step-height difference of the intermediate insulating layer, e.g., the BPSG film, can be reduced during the formation of the contact hole.

In addition, the oxide film 24 may be formed as a 1,000 Å to 2,000 Å thick layer of a high temperature oxide film, and in the specific example, the high temperature oxide film is formed with a 1,500 Å thickness.

Figure 6:
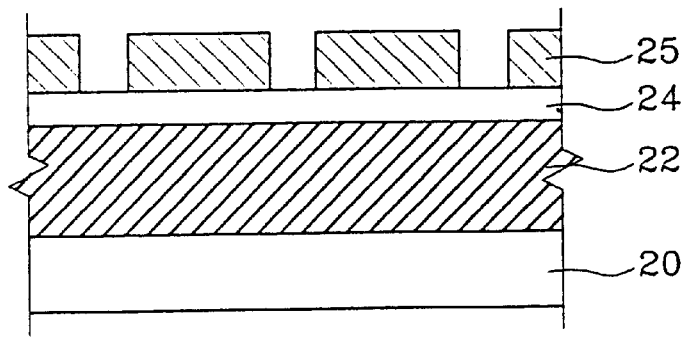
Figure 7:
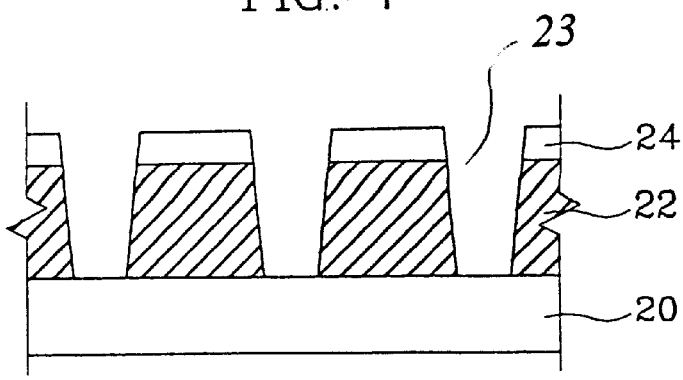

FIGS. 6 and 7 show that contact holes 23 are formed by removing certain portion of the insulating layer 22 and the oxide film 24. Here, the contact hole 23 is formed using a photo lithographic process using a photoresist 25. The source electrode of a transistor and the storage electrode of a capacitor are in communication with each other in the above certain region, i.e., through the contact holes 23.

Figure 8:
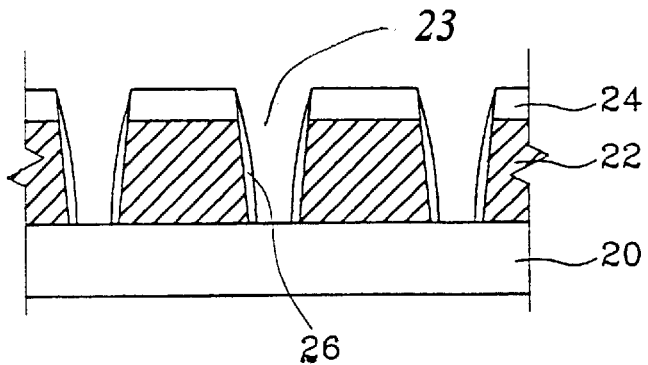

FIG. 8 shows a side wall spacer 26 formed on the side walls of the insulating layer 22 and the oxide film 24 including the contact holes by carrying out an etch back process. The side wall spacer 26 is intended to prevent the aligning-failure during the following etching of the polysilicon film 28 which serves as a lower electrode material layer of a capacitor, and to prevent the short of the component elements of the semiconductor device. In the specific example, the side wall spacer 26 of the present invention is formed by employing a nitride film.

Figure 9:
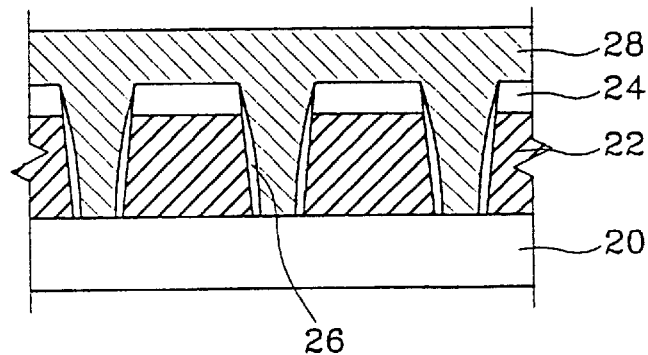

FIG. 9 shows a polysilicon film 28 formed on the oxide film 24 over the semiconductor substrate 20 containing contact hole. Here, the polysilicon film 28 is formed as a lower electrode material layer, serving as a storage electrode of a capacitor of the present invention. The polysilicon film 28 of the present invention may be amorphous poly silicon film, and have a thickness of 7,000 Å~12,000 Å relative to the surface of the oxide film 24. In the specific example, the polysilicon film 28 is formed as 9,000 Å thick layer of amorphous silicon film.

Figure 10:
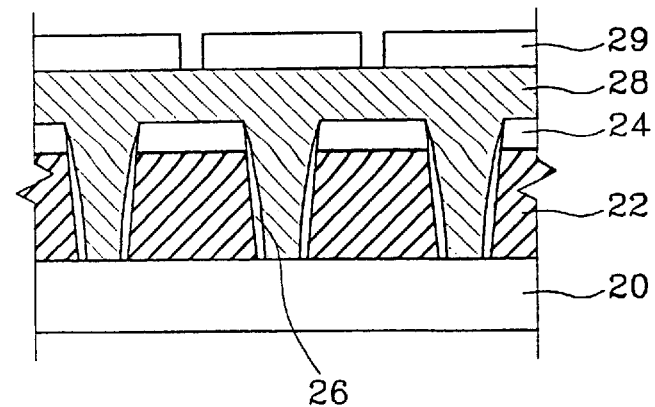
Figure 11:
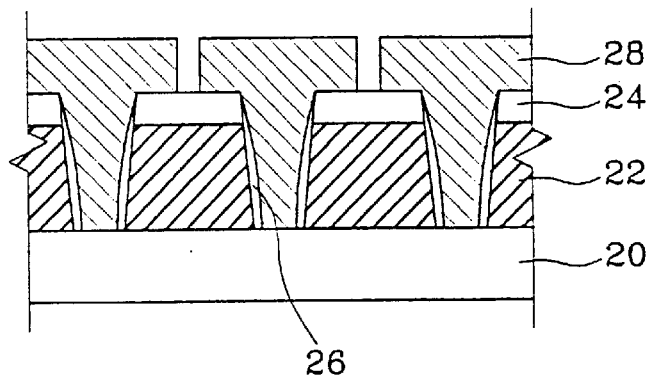
Figure 12:
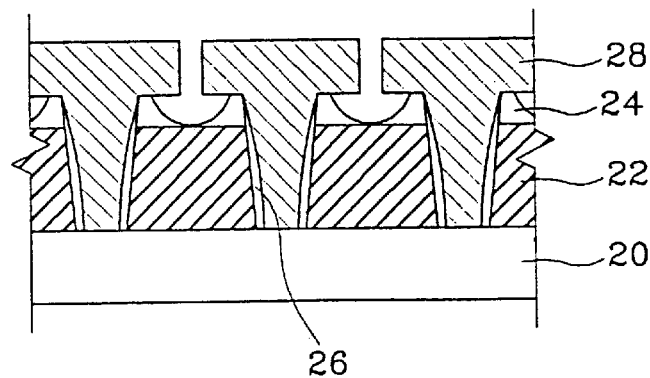

FIGS. 10 and 11 show that the polysilicon film 28 is removed by carrying out photolithography using photoresist 29 such that the oxide film 24 is exposed. Then, FIG. 12 shows that the oxide film 24 exposed by the removal of the polysilicon film 28 is undercut, and the polysilicon film 28 exposed by the undercutting of the oxide film is cleaned.

The undercutting of the oxide film 24 and the cleaning of the polysilicon film 28 exposed by the undercut are preferably carried out "in-situ" by using a bath containing different kinds of chemicals. The undercutting of the oxide film 24 and the cleaning preferably include a first bath process using mixed chemicals of HF and $NH_4F$, a second bath process using SC-1 chemical, and a third bath process using HF chemical.

The first bath process is preferably carried out at a temperature of 20° C. to 30° C. for 90 to 120 sec., and in the specific example, at a temperature of 25° C. for 100 sec. The second bath process is preferably carried out at a temperature of 60° C. to 80° C. for 300 to 600 sec, and in the specific example, at a temperature of 70° C. for 500 sec. The SC-1 used in the second bath process is a standard chemical used in the semiconductor device fabrication process, and it generally comprises $NH_4OH$, $H_2O_2$, and $H_2O$, which are mixed with a certain rate. The third bath process is preferably carried out at a temperature of 20° C. to 30° C. for 60 to 180 sec., and in the specific example, at a temperature of 25° C. for 120 sec.

After the undercutting and cleaning, the oxide film 24 is undercut by 500 Å to 1,000 Å, such that the thickness of the oxide film 24 is up to 1,000 Å.

Accordingly, down to the lower surface of the polysilicon film 28, that is, the interface surface of the polysilicon film 28 and the oxide film 24, a lower electrode material layer of the capacitor is filled.

Figure 13:
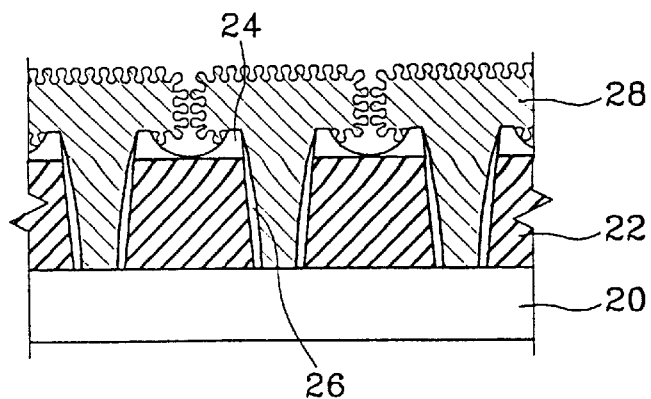

FIG. 13 shows that the surface of the polysilicon film 28 is formed as hemispherical-shape by carrying out a HSG process such that the surface area of the polysilicon film 28 is increased. In the HSG process of the present invention, a seeding process and an annealing process are carried out in sequence and further, those above processes are carried out in a processing chamber "in-situ".

The Seeding process is carried out in order to distort the structure of the amorphous polysilicon film 28. The seeding process may be carried out at a temperature of 550° C.~570° C. for 45 min. ~55 min. with $10^{-2}$ Torr~$10^{-4}$ Torr of pressure, and it is carried out in such a manner that 80 cc~140 cc of $SiH_4$ is supplied per minute to He (helium) gas which is already supplied. The seeding process is carried out such that the mixed rate of He gas and $SiH_4$ is maintained with 1~1.5:1. In the specific example, the seeding process is carried out at a temperature of 560° C. for 50 min. with $10^{-3}$ Torr of pressure, and the $SiH_4$ gas is supplied at a rate of 1,200 cc per min. such that the mixed rate of He gas and $SiH_4$ gas is maintained 1.2:1.

After discharging the above gases out of the processing chamber, the annealing process is carried out, preferably at a temperature of 550° C.~570° C. for 50~60 min. with $10^{-7}$~$10^{-9}$ Torr of pressure, and in the specific example, it is carried out at a temperature of 560° C. for 55 min. with $10^{-8}$ Torr of pressure.

In the HSG process carried out "in-situ" in the common processing chamber, that is, the seeding process and the annealing process, the control for the gas supply and the pressure can be made in the chamber, a common processing chamber, which is easily understood by those skilled in the art.

After the HSG process of the present invention, the polysilicon film 28 with its surface area increased may be cleaned by using SC-1 chemical. In the present invention, a nitride film (not shown) may be formed on the polysilicon film 28 after cleaning.

The polysilicon film 28 is formed as lower electrode material layer of a capacitor, and the undercutting of the oxide film 24 and cleaning are carried out "in-situ", and then the HSG process is carried out in order to increase the surface area of the polysilicon film 28.

Accordingly, according to the present invention, the surface of the polysilicon film 28, serving as a lower electrode material layer of a capacitor is stably formed as a hemispherical-shape so that the capacitance of the capacitor is increased. That is, according to the present invention, the surface of the polysilicon film 28 is stabilized by the undercutting of the oxide film 24, and hemispherical-shape of the lower surface of the polysilicon film 28 is maintained. Accordingly, the capacitance of the capacitor is increased through the stabilization of the surface area of the polysilicon film 28. That is, according to the present invention, the surface area of the polysilicon film 28, serving as a lower electrode of a capacitor, is safely guaranteed in the attempt to increase capacitance of the capacitor.

Therefore, according to the present invention, the capacitance of the capacitor is maximized, and the reliability of the semiconductor devices manufactured thereby is improved by increasing the surface area of the lower electrode material layer of the capacitor as described above.

Still further, while the present invention has been described in detail, it should be understood that various changes, substitutions and alterations can be made hereto without departing from the spirit and scope of the invention as defined by the appended claims.

What is claimed is:

1. A method of forming a capacitor of semiconductor devices comprising:
   a) forming insulating layers with an oxide film placed on top in sequence on a semiconductor substrate with a pattern formed thereon, and removing a predetermined portion of the insulating layers so as to form a contact hole;
   b) forming a lower electrode material layer of a capacitor on the oxide film over the semiconductor substrate containing the contact hole;
   c) removing the lower electrode material layer so as to expose a certain portion of the oxide film;
   d) undercutting the oxide film exposed by the removing of the lower electrode material layer;
   e) cleaning the surface containing the lower surface of the lower electrode material layer exposed by the undercutting of the oxide film; and
   f) carrying out a hemispherical grain (HSG) process in order to increase a surface area containing the lower surface of the lower electrode material layer exposed by the undercutting of the oxide film.

2. The method of claim 1, further comprising forming a side wall spacer on side walls of the insulating layers between the above a) forming of the insulating layers and b) the forming of the lower electrode material layer.

3. The method of claim 2, wherein the side wall spacer is formed as a nitride film.

4. The method of claim 1, further comprising forming an insulating film over the lower electrode material layer after cleaning the lower electrode material layer with its surface increased by the above HSG process.

5. The method of claim 4, wherein the cleaning of the lower electrode material layer with its surface area increased by the HSG process includes using an SC-1 chemical.

6. The method of claim 1, wherein films under the oxide film are intermediate insulating layers.

7. The method of claim 6, wherein the intermediate insulating layer is a boron phosphorus silicate glass film.

8. The method of claim 1, wherein the oxide film is a high temperature oxide.

9. The method of claim 1, wherein the forming of the oxide film includes forming a film with a thickness between 1,000 to 2,000 Å.

10. The method of claim 1, wherein the lower electrode material layer is a polysilicon film.

11. The method of claim 10, wherein the polysilicon film is an amorphous polysilicon film.

12. The method of claim 10, wherein the polysilicon film is formed with 7,000 to 12,000 Å of thickness.

13. The method of claim 1, wherein the undercutting of the oxide film and the cleaning are carried out "in-situ" by using a bath containing different kinds of chemicals from one another.

14. The method of claim 13, wherein the undercutting and the cleaning are carried out by performing a first bath process using chemicals having HF and $NH_4F$ mixed together, a second bath process using SC-1 chemical, and a third bath process using HF chemical in sequence.

15. The method of claim 14, wherein the first bath process is carried out at a temperature of 20 to 30° C. for 90 to 120 sec.

16. The method of claim 14, wherein the second bath process is carried out at a temperature of 60 to 80° C. for 300 to 600 sec.

17. The method of claim 14, wherein the third bath process is carried out at a temperature of 20 to 30° C. for 60 to 180 sec.

18. The method of claim 1, wherein the HSG process includes a seeding process and an annealing process carried out in sequence.

19. The method of claim 18, wherein the seeding process and the annealing process are carried out "in-situ" inside one processing chamber.

20. The method of claim 18, wherein the seeding process is carried out at a temperature of 550 to 570° C. with $10^{-2}$ to $10^{-4}$ Torr of pressure for 45 to 55 min.

21. The method of claim 18, wherein the seeding process includes supplying $SiH_4$ gas to presupplied He (helium) gas at a rate of 80 to 140 cc per min.

22. The method of claim 18, wherein the seeding process includes maintaining a mixed ratio of He gas and $SiH_4$ gas at 1 to 1.5:1.

23. The method of claim 18, wherein the annealing process is carried out at a temperature of 550 to 570° C. with $10^{-7}$ to $10^{-9}$ Torr pressure for 50 to 60 min.

24. A method of forming a capacitor of semiconductor devices comprising:

a) forming multi-layers including an intermediate insulating layer and an oxide film in sequence over a semiconductor substrate with a predetermined pattern thereon, and removing a certain portion of the above multi-layers so as to form a contact hole;

b) forming a side wall spacer with a nitride film on the side walls of the multi-layers including the contact hole;

c) forming an amorphous polysilicon film, serving as a lower electrode material layer of a capacitor, over a semiconductor substrate having the side wall spacer and the contact hole;

d) removing a part of the amorphous polysilicon film such that a certain portion of the oxide film is exposed;

e) undercutting the oxide film exposed by the removing of the amorphous polysilicon film;

f) cleaning the surface including the lower surface of the amorphous polysilicon film exposed by the undercutting of the oxide film;

g) carrying out a hemispherical grain (HSG) process such that a surface area including the lower surface of the amorphous polysilicon film exposed by the undercutting of the oxide film is increased;

h) cleaning the amorphous polysilicon film with its surface area increased by the HSG process; and i) forming an insulating film over the amorphous polysilicon film.

25. The method of claim 24, wherein the undercutting and the cleaning are carried out by "in situ" performing a first bath process using chemicals having HF and $NH_4F$ mixed together, a second bath process using SC-1 chemical, and a third bath process using HF chemical.

26. The method of claim 25, wherein the first bath process is carried out at a temperature of 20 to 30° C. for 90 to 120 sec, the second bath process is carried out at a temperature of 60 to 80° C. for 300 to 600 sec, and the third bath process is carried out at a temperature of 20 to 30° C. for 60 to 180 sec.

* * * * *